United States Patent
Thompson et al.

(10) Patent No.: US 6,359,217 B1
(45) Date of Patent: Mar. 19, 2002

(54) CABINET WITH ELECTRICAL/DATA CONDUIT ROUTING CAPABILITIES

(75) Inventors: James J. Thompson, Holland; Michael R. Yob, Allendale; Adam A. Luedke, Holland; David Williams, Holland, all of MI (US)

(73) Assignee: Trendway Corporation, Holland, MI (US)

( * ) Notice: Subject to any disclaimer, the term of this patent is extended or adjusted under 35 U.S.C. 154(b) by 0 days.

(21) Appl. No.: 09/325,327

(22) Filed: Jun. 3, 1999

Related U.S. Application Data

(60) Provisional application No. 60/127,083, filed on Mar. 31, 1999, and provisional application No. 60/088,069, filed on Jun. 5, 1998.

(51) Int. Cl.⁷ .............................. H05K 5/02
(52) U.S. Cl. .................. 174/50; 174/60; 312/223.6
(58) Field of Search .................. 174/48, 50, 72 A, 174/59, 52.1, 60; 220/3.2, 3.3, 4.02; 52/239; 361/600, 625; 312/223.6

(56) References Cited

U.S. PATENT DOCUMENTS

| | | | |
|---|---|---|---|
| 3,024,075 A | 3/1962 | Howe | |
| 3,166,799 A | * 1/1965 | Birnkrant | 297/14 |
| 3,489,479 A | 1/1970 | Sulentic | |
| 3,631,324 A | 12/1971 | Jones | 361/625 |
| 3,856,981 A | 12/1974 | Boundy | 174/48 |
| 4,067,161 A | 1/1978 | Rensch | |
| 4,103,981 A | 8/1978 | Donahue et al. | |
| 4,265,502 A | 5/1981 | Blodee et al. | |
| 4,278,834 A | * 7/1981 | Boundy | 174/48 |
| 4,685,255 A | * 8/1987 | Kelley | 174/48 |
| 4,692,984 A | 9/1987 | McKernan et al. | |
| 4,966,424 A | 10/1990 | Schneider | |
| 5,106,173 A | 4/1992 | Kelley et al. | |
| 5,161,870 A | 11/1992 | Mason et al. | |
| 5,165,770 A | 11/1992 | Hahn | 361/394 |
| 5,176,435 A | 1/1993 | Pipkens | |
| 5,472,269 A | 12/1995 | Novikoff | |
| 5,574,251 A | 11/1996 | Sevier | 174/50 |
| 5,595,494 A | * 1/1997 | Wiebe | 174/48 |
| 5,626,404 A | 5/1997 | Kelley et al. | |
| 5,809,708 A | 9/1998 | Greer et al. | |
| 5,813,177 A | 9/1998 | Wu | |
| 5,839,240 A | 11/1998 | Elsholz et al. | |
| 5,889,648 A | 3/1999 | Heavirland et al. | 361/600 |
| 5,894,106 A | 4/1999 | Schwenk et al. | 174/50 |
| 5,994,644 A | * 11/1999 | Rindoks et al. | 174/48 |
| 5,969,292 A | 12/1999 | Snider, Jr. et al. | 174/48 |
| 6,011,221 A | * 1/2000 | Lecinski | 174/72 A |
| 6,017,228 A | * 1/2000 | Verbeek et al. | 174/49 |
| 6,098,358 A | * 8/2000 | Waalkes et al. | 52/239 |
| 6,169,249 B1 | 1/2001 | Teachout et al. | 174/52.1 |

* cited by examiner

*Primary Examiner*—Dean A. Reichard
*Assistant Examiner*—Angel R. Estrada
(74) *Attorney, Agent, or Firm*—McGarry Bair LLP

(57) ABSTRACT

A cabinet for a workspace definition system is provided which comprises a housing defined by a rear wall, a pair of side walls, a top wall and a bottom wall interconnected together to form an integral unit surrounding an interior chamber. One of the top wall, the rear wall and the side walls further comprises a port, and a length of electrical/data conduit extends through the port into at least one of the rear wall, the side walls, and the interior chamber of the cabinet. One of the top wall, the rear wall and the side walls can also have an electrical/data receptacle mounted therein and accessible from the outside of the cabinet. The electrical/data conduit is thereby passed into the walls and the interior chamber of the cabinet in a concealed manner to provide operability to components stored within or adjacent to the cabinet.

53 Claims, 15 Drawing Sheets

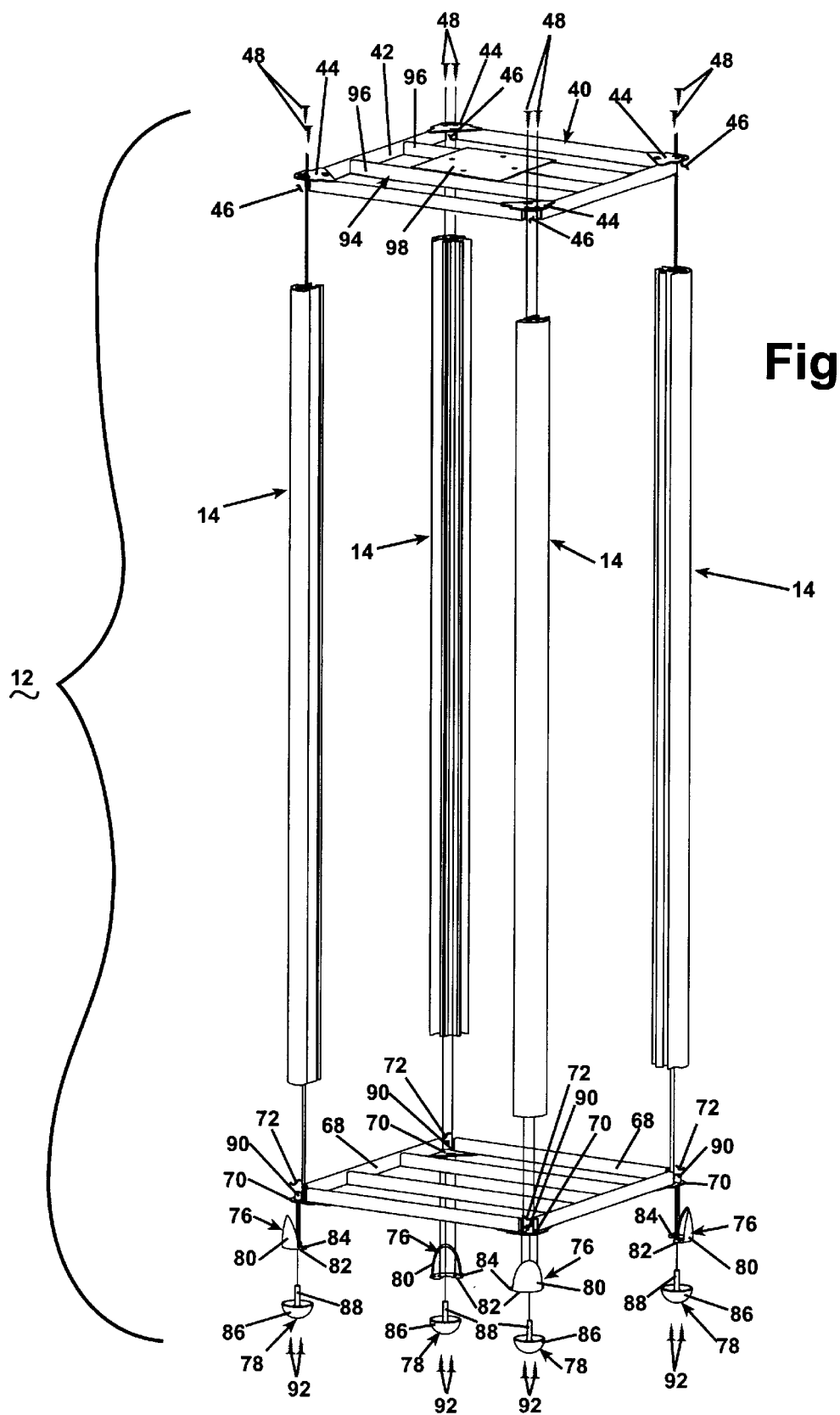

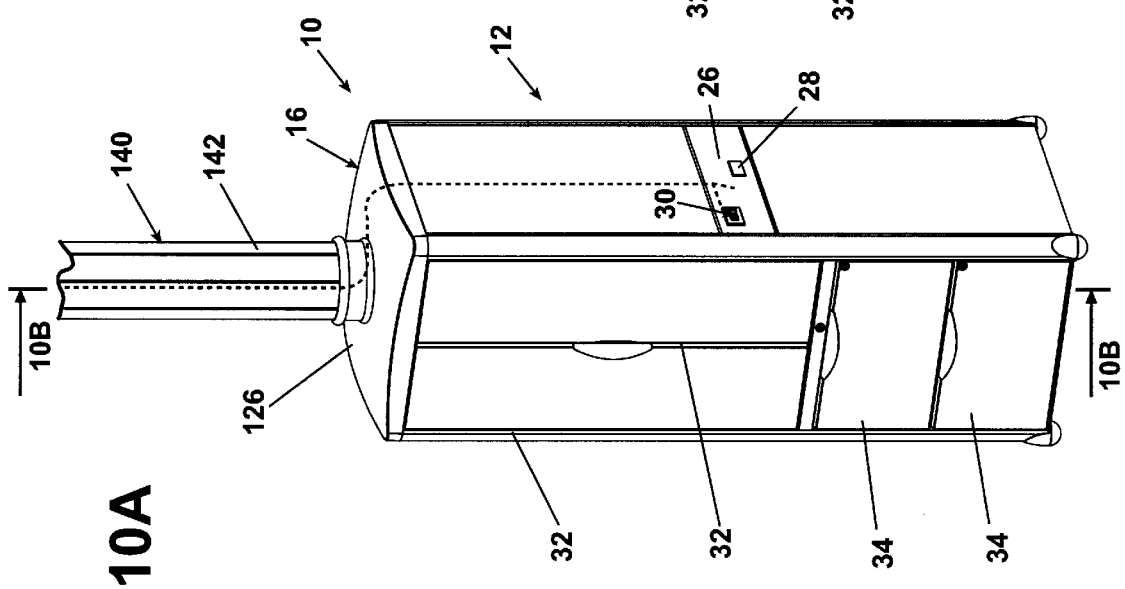

CABINET WITH ELECTRICAL/DATA CONDUIT ROUTING CAPABILITIES

CROSS-REFERENCE TO RELATED APPLICATIONS

This application claims the benefit of U.S. Provisional Application No. 60/088,069, filed on Jun. 5, 1998 and U.S. Provisional Patent Application No. 60/127,083, filed on Mar. 31, 1999.

BACKGROUND OF THE INVENTION

1. Field of the Invention

This invention relates to a cabinet for a workspace management system having the capability for routing electrical/data conduit throughout the walls of the cabinet so that the conduit is concealed from view by an occupant of the workspace management system. More specifically, the invention relates to a cabinet having an inner wall spaced from an outer wall creating a gap therebetween whereby electrical/data conduit can enter and exit the cabinet and be routed throughout the cabinet within the gap between the inner and outer wall.

2. Related Art

Office furniture systems often include freestanding cabinets or cabinets that attach to a freestanding wall. For example, freestanding cabinets can include various components such as adjustable shelves and storage bins such as those shown in U.S. Pat. Nos. 4,274,687 to Bayles et al., U.S. Pat. No. 4,174,486 to Winkler, and U.S. Pat. No. 3,067,882 to Ribbens et al. For example, it is also known to mount a cabinet to a freestanding wall by hooks on the cabinet which engage vertical rail members mounted to the wall as shown in U.S. Pat. Nos. 4,618,192, issued Oct. 21, 1986. However, with the ever-increasing presence of electronic components in the workplace such as fax machines, personal computers, laser printers coupled with the requirements that these components often be operably interconnected by a data network, these prior art cabinets are ineffective in receiving and routing electric/data conduit to these components.

One such solution is proposed in U.S. Pat. No. 5,106,173 to Kelley et al. which discloses a workspace management system including freestanding walls and a freestanding cabinet integrated into the wall system and separate from the wall system. Wire management capability is provided in a base portion of the cabinet to interface with wire management in the freestanding walls thereby allowing electrical/data conduit to be routed through the base portion of the cabinet.

The solution proposed in the Kelley patent is apparently only effective if the electrical/data conduit is to be routed past the cabinet. However, a user could not store one of the above-mentioned electronic components inside one of the Kelley cabinets because the electric/data conduit could not extend inside the cabinet or does not permit a component to be operably interconnected to the electric/data conduit routed through the base portion of the cabinet.

The prior art cabinets for use in an office space furniture system are inadequate for several reasons. First, the prior art does not allow for electric/data conduit to be routed throughout the cabinet for entry and egress to and from the cabinet at multiple locations. Second, the prior art cabinets do not allow for mounting of an electric/data socket for receiving a power or network cable from an electronic/computer component either mounted inside the cabinet or placed adjacent to the cabinet. Third, access to and routing of electric/data conduits is difficult and inadequate if the electric/data conduit is routed at any height other than directly adjacent the floor.

SUMMARY OF THE INVENTION

The invention relates to a cabinet for a workspace definition system comprising a housing defined by a rear wall, a pair of side walls, a top wall and a bottom wall interconnected together to form an integral unit surrounding an interior chamber.

In one aspect the invention relates to one of the top wall, the rear wall and the side walls further comprising a port, and a length of electrical/data conduit extends through the port into at least one of the rear wall, the side walls, and the interior chamber of the cabinet. The electrical/data conduit is thereby passed into the walls and the interior chamber of the cabinet in a concealed manner to provide operability to components stored within or adjacent to the cabinet.

The port can be provided in the top wall. A column with a hollow interior can be mounted to the top wall at the port, and the length of electrical/data conduit can extend from the hollow interior of the column and into the port. The port can be provided in one of the rear wall and the side walls. A generally horizontal beam with a hollow interior can be mounted to the cabinet in overlying relationship to the port, and the length of electrical/data conduit can extend from the hollow interior of the beam and into the port.

The rear wall and the side walls can further comprise a rigid skeletal frame having inner and outer panels mounted thereto and which define a gap therebetween for routing electrical/data conduit therethrough. At least some of the outer panels can be easily mounted and dismounted to the frame without the use of tools. At least some of the outer panels can further comprise a plurality of clips, the frame can comprise a plurality of openings in register with the plurality of clips, and the easy mounting and dismounting of the outer panels to the frame is accomplished by inserting the clips within the openings. At least one of the outer panels can comprise at least one of an electrical receptacle and a data receptacle accessible from outside the cabinet, and can be operably interconnected to the length of electrical/data conduit routed within the cabinet.

The skeletal frame can comprise a plurality of generally vertical rails rigidly interconnected at top ends thereof by a top bracket and at bottom ends thereof by a bottom bracket. The vertical rails can comprise a first flange and a second flange spaced inwardly from the first flange, wherein the outer panels are mounted to the first flange and the inner panels are mounted to the second flange.

At least one of the rear wall and the side walls can include at least one of an electrical receptacle and a data receptacle accessible from outside the cabinet, and can be operably interconnected to the length of electrical/data conduit routed within the cabinet. At least one of an electrical receptacle and a data receptacle can comprise an electrical receptacle, and further comprising a power block mounted to one of the walls of the cabinet and operably interconnected to the electrical receptacle and to the length of electrical/data conduit.

A cap can be provided which is mountable within the port having an upper surface configured to wholly close the port when the length of electrical/data conduit is removed from the port. The cap can include a plurality of detent arms adapted to snap-fit within the port.

At least one of the inner panels can include an opening adapted to receive a length of the electrical/data conduit therethrough. The cabinet can further comprise an open front, and can further comprise at least one of a hinged door and at least one drawer mounted therein.

In another aspect, the invention relates to a cabinet for a workspace definition system comprising a housing defined by a rear wall, a pair of side walls, a top wall and a bottom wall interconnected together to form an integral unit surrounding an interior chamber. One of the top wall, the rear wall and the side walls can have an electrical/data receptacle mounted therein and accessible from the outside of the cabinet.

The electrical/data receptacle can be positioned at worksurface height. The rear wall and the side walls can further comprise a rigid skeletal frame having inner and outer panels mounted thereto and which define a gap therebetween for routing electrical/data conduit therethrough. At least some of the outer panels can be easily mounted and dismounted to the frame without the use of tools.

At least some of the outer panels can further comprise a plurality of clips, the frame can comprise a plurality of openings in register with the plurality of clips, and the easy mounting and dismounting of the outer panels to the frame can be accomplished by inserting the clips within the openings. The skeletal frame can comprise a plurality of generally vertical rails rigidly interconnected at top ends thereof by a top bracket and at bottom ends thereof by a bottom bracket. The vertical rails can comprise a first flange and a second flange spaced inwardly from the first flange, wherein the outer panels can be mounted to the first flange and the inner panels are mounted to the second flange.

A length of electrical/data conduit can be routed within the gap having one end operably interconnected to the electrical/data receptacle. The cabinet can further comprise an open front, and further comprising at least one of a hinged door and at least one drawer mounted therein.

Other objects, features, and advantages of the invention will be apparent from the ensuing description in conjunction with the accompanying drawings.

BRIEF DESCRIPTION OF THE DRAWINGS

In the drawings:

FIG. 2 is a fragmentary exploded perspective view showing a first step of assembling a support frame for the cabinet of FIG. 1 comprising a top bracket, a bottom bracket, four upstanding rails extending therebetween, and four modular feet for mounting to the bottom bracket and supporting the cabinet on a ground surface;

FIG. 10A is a perspective view showing the interface of the cabinet of FIG. 1 with a columnar workspace dividing system whereby electrical/data conduit received from the columnar workspace management system is received through a port in the top cover of the cabinet and routed within the gap between the inner walls and outer panels thereof to a socket on the power panel;

FIG. 10C is a perspective view of the cabinet as illustrated in FIGS. 1–1C showing the interface of the cabinet with a columnar workspace dividing system whereby electrical/data conduit is received from a horizontal beam in the columnar workspace management system through a port in a side wall of the cabinet and routed within the gap between the inner walls and outer panels thereof to a socket on the power panel.

DETAILED DESCRIPTION

Figure 1:
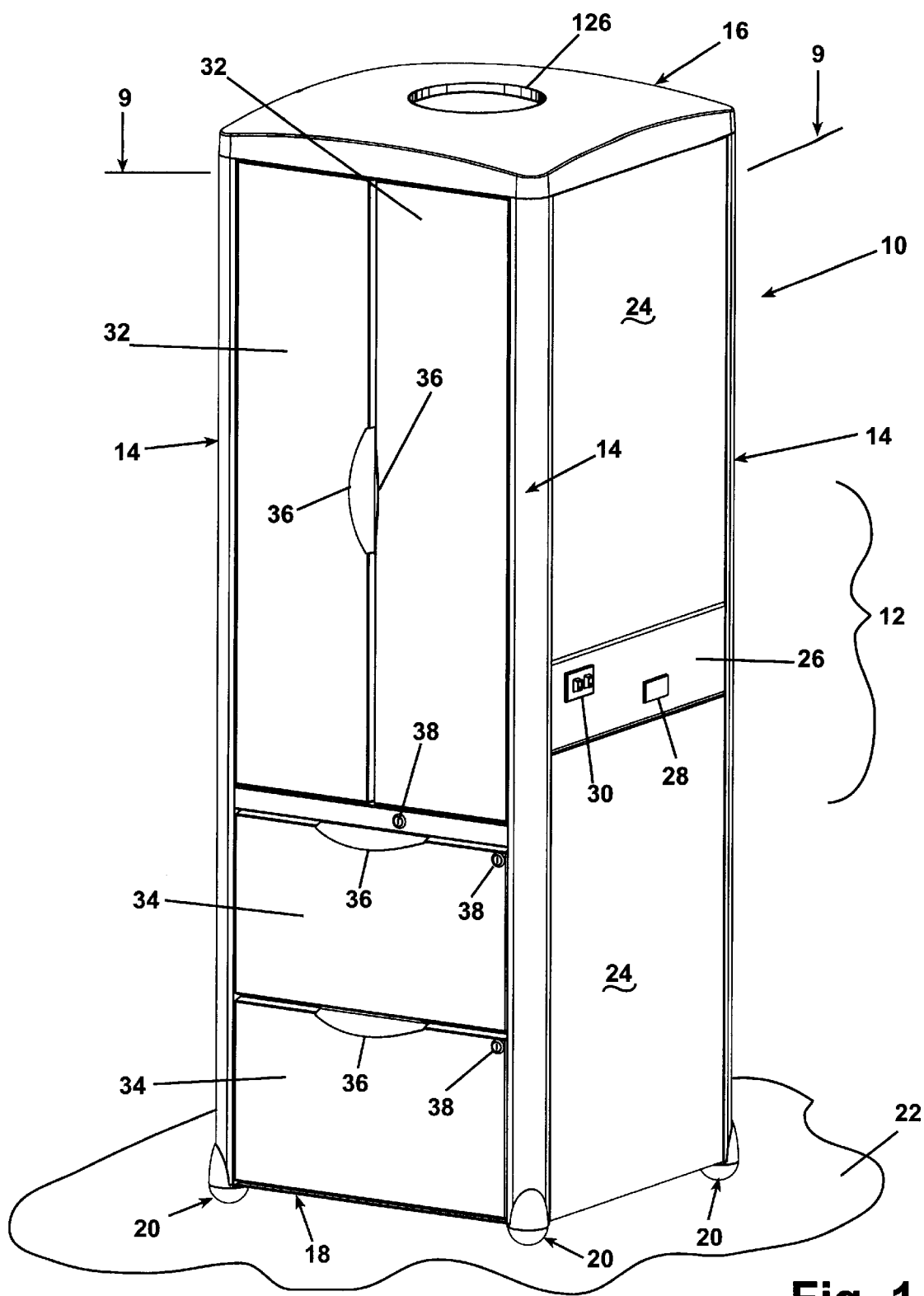
FIG. 1 is a perspective view of a cabinet for routing electrical/data conduit therethrough according to the invention comprising an upstanding cabinet having a pair of doors in an upper portion thereof and a pair of drawers in a lower portion thereof and a port in a top portion thereof and a power panel for providing sockets for electrical/data components interconnected to any electrical/data conduit routed throughout the cabinet.

FIG. 1 shows a cabinet 10 according to the invention comprising a support frame 12 with four vertical rails 14 extending between a top cover 16 and a bottom bracket 18 which has four feet 20 adapted to support the cabinet 12 on a ground surface 22. Three sides of the cabinet 10 are provided with at least one outer panel 24 and/or a power panel 26 which is adapted to provide access to various electrical and data sockets 28 and 30, respectively. A front face of the cabinet 10 is provided with various conventional hinged doors 32 and file drawers 34, each provided with appropriate pull handles 36 and locks 38.

FIG. 1 shows a configuration of the cabinet 10 having a power panel 26 located on a central portion of one side of the cabinet 10 between a pair of outer panels 24 as well as a front face provided with an upper portion with a pair of hinged doors 32 and a lower portion provided with a pair of drawers 34 in a stacked relationship to one another.

FIGS. 1 A–1C show alternative embodiments of the cabinet 10 wherein like components common to the embodiment of the cabinet 10 shown in FIG. 1 are identified with common reference numerals 10–38.

Figure 1A:
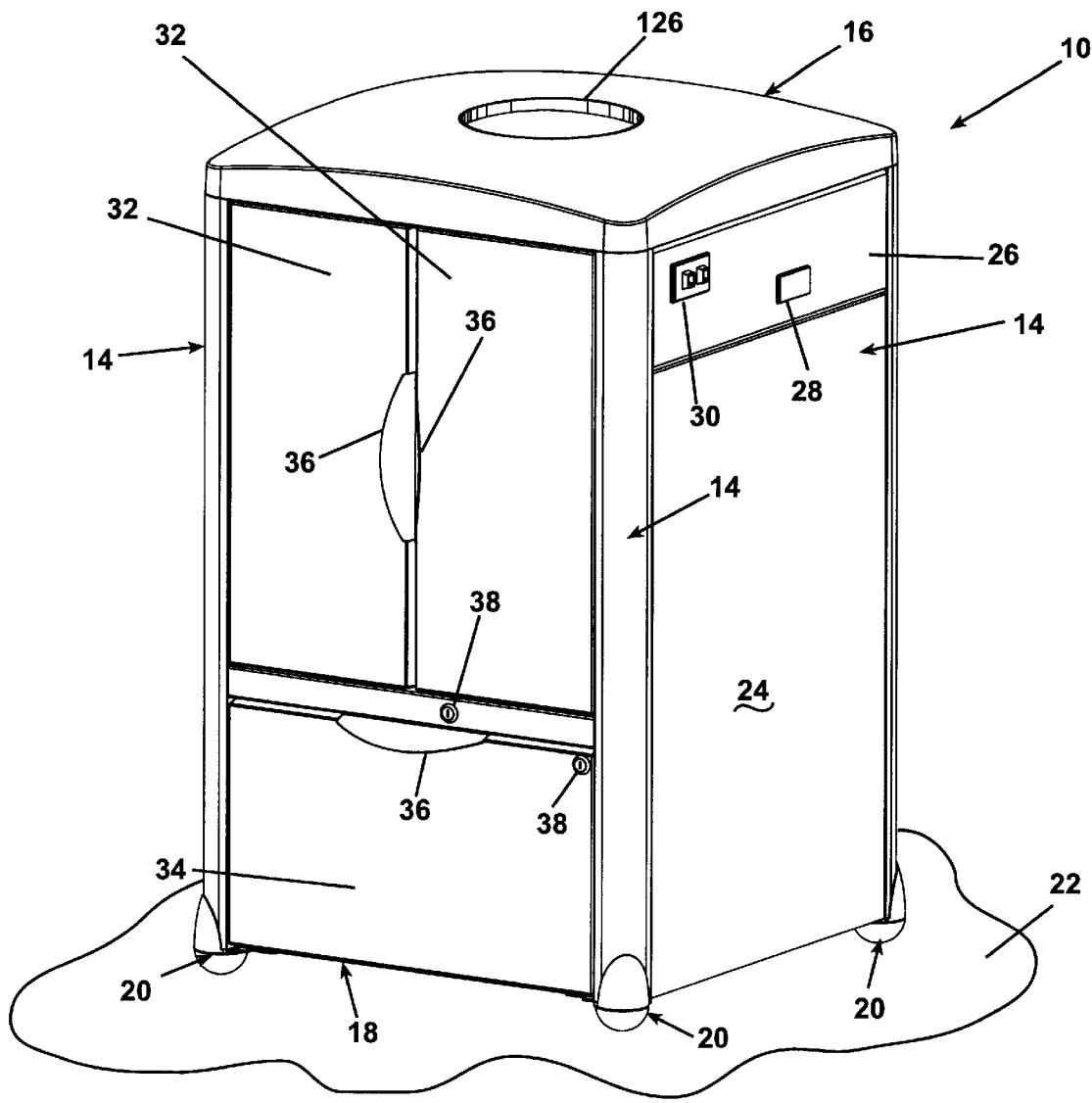
FIG. 1A is a cabinet according to the invention in a shorter configuration with only a single drawer in a lower portion thereof.

In the embodiment of FIG. 1A, a shorter cabinet 10 is shown having a power panel 26 located adjacent an upper portion of one of the sides of the cabinet 10 and a front face provided with an upper portion with a pair of hinged doors 32 and a lower portion with a single drawer 34.

Figure 1B:
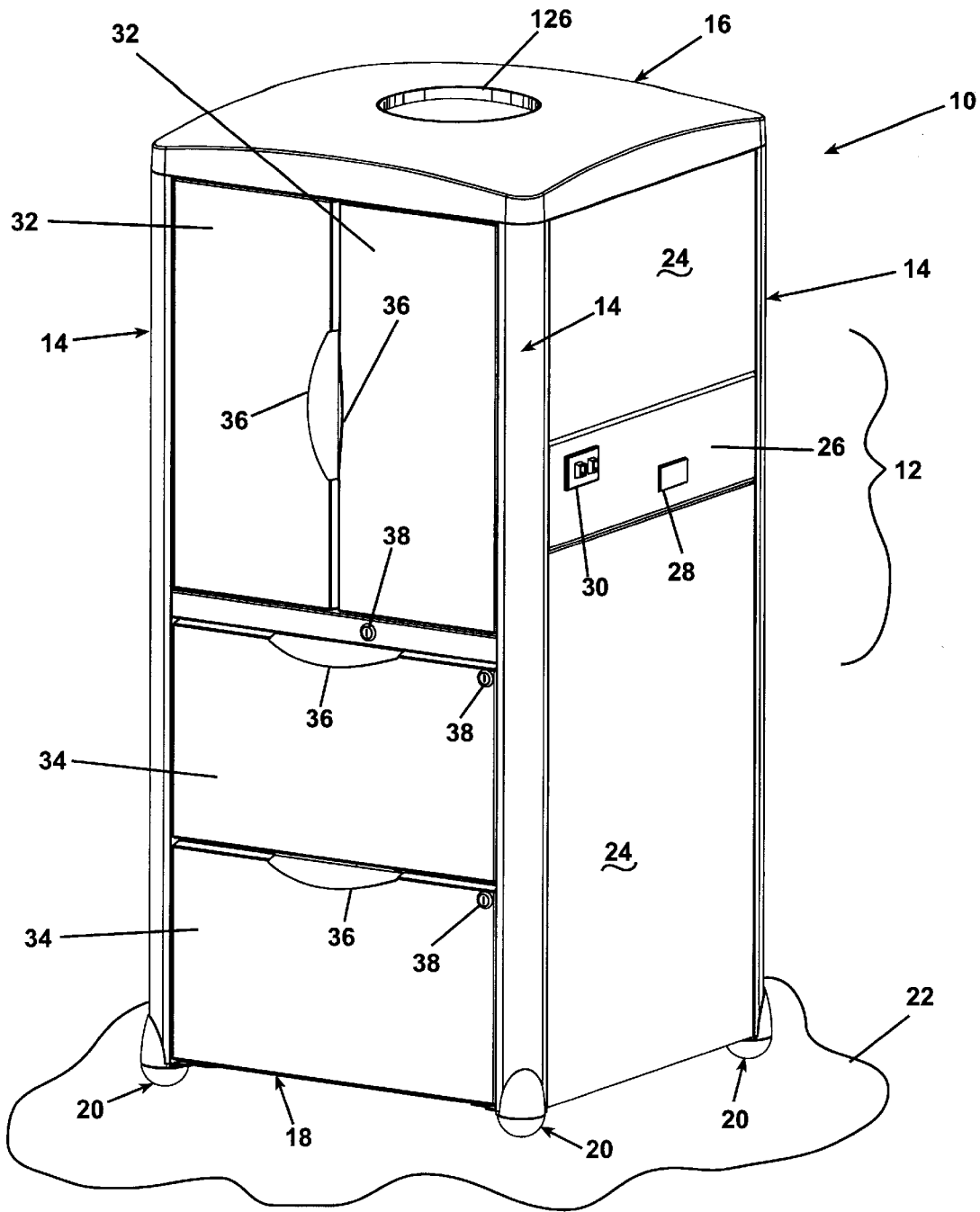
FIG. 1B is a cabinet according to the invention in a shorter configuration with two doors in an upper portion thereof and two drawers in a lower portion thereof.

In the embodiment of FIG. 1B, a larger cabinet 10 is shown having a power panel 26 located in an upper third of one side of the cabinet 10 and a front face provided with a pair of smaller hinged doors 32 and a lower portion provided with a pair of drawers 34 in a stacked relationship with one another.

Figure 1C:
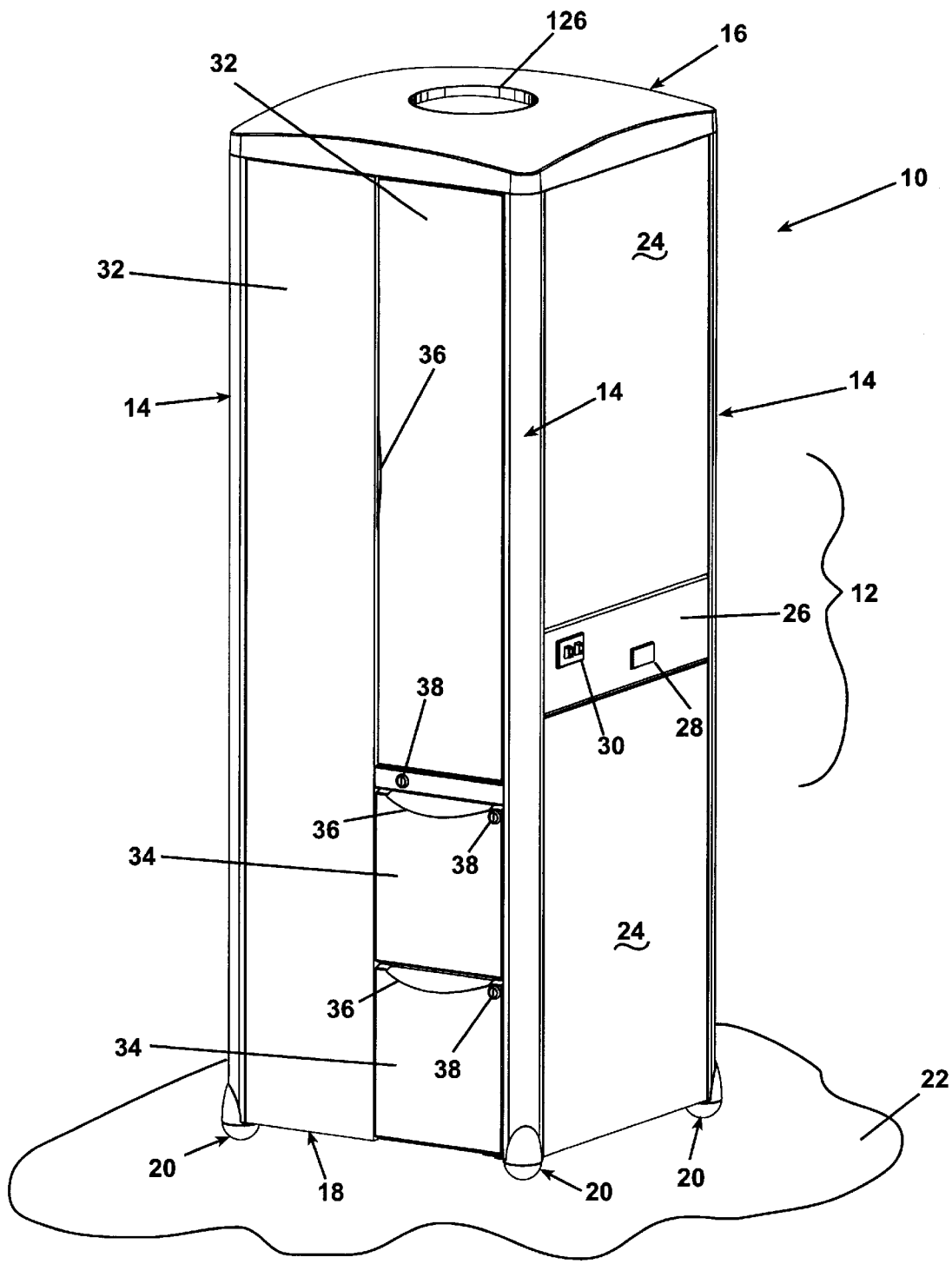
FIG. 1C is a cabinet according to the invention having a "split" configuration whereby a front face of the cabinet is provided with a single door in an upper portion thereof and a pair of narrow drawers in a stacked configuration in a lower portion thereof whereby the opposite face of the cabinet is provided with a single door in an upper portion thereof and two single drawers in a lower portion thereof in a mirror image to the front face whereby one-half of the cabinet can be accessed from each face of the cabinet.

In the embodiment shown in FIG. 1C, a "split"-type cabinet 10 is shown wherein the front and rear faces of the cabinet 10 are mirror images of one another wherein the front face of the cabinet 10 comprises a single hinged door 32 occupying one-half of an upper portion of the front face of the cabinet 10 and a pair of narrow drawers 34 in a stacked relationship in a lower portion of the front face of the cabinet 10. The rear face of the cabinet 10 is a mirror image to the front face whereby users in opposite sides of the cabinet 10 can be provided exclusive access to one-half of the volume of the cabinet 10 so that multiple users may store items in the cabinet 10. A power panel 26 is shown on one side of the cabinet 10 located in a central portion thereof.

The embodiments of FIGS. 1, 1A, 1B, and 1C are shown as a few examples of the many possibilities of the configurations for the cabinet 10. It will be understood that various combinations of the doors 32, drawers 34, placed in upper and lower portions thereof, as well as the location of the power panels 26 at various locations around any of the sides of the cabinet 10, including the front face thereof, can be contemplated without departing from the scope of this invention. Further, in the case of the split-type cabinet 10 shown in FIG. 1C, it will be understood that additional or fewer combinations of the power panels 26, doors 32, and drawers 34 can be provided without departing from the scope of this invention. Further, the outer panels can comprise any known tile surface commonly employed in office furniture environments including, but not limited to, fabric tiles, acoustical tiles, markerboard tiles, tackable tiles, etc.

Regardless of the particular configuration of the cabinet 10 shown in FIGS. 1, 1A, 1B, 1C or any other variation thereof, it is an important feature of this invention that the cabinet 10 have the capability of receiving electrical/data conduit through an entry point in the cabinet 10, route the electrical/data conduit throughout the cabinet 10 in a concealed manner, and provide ports for allowing a user to operably interconnect electrical/data components to sockets 28 and 30 in the cabinet 10. The electrical/data components can thereby be operated either from within the cabinet 10 or adjacent to the cabinet 10 and the electrical/data conduit operably connected to the electrical/data components is concealed from view. In addition, the power panels 26, although mountable to the cabinet 10 at any height relative to the floor surface 22, are preferably mounted to the cabinet 10 at desk height so that the sockets 28 and 30 adapted to operably receive cabling from an electronic/network component is easily accessible if the component is placed on a table directly adjacent to the cabinet 10. Thus, an aesthetically-pleasing exterior appearance to the cabinet 10 is maintained without a great number of unsightly cords, cables, and other electrical/data conduit being seen by users of the cabinet 10.

Turning to FIG. 2, the cabinet 10 is provided with a support frame 12 to which an inner wall and outer panels can be attached so that a gap is defined between the inner walls and outer panels. Electrical/data conduit can be routed within the gap and thereby concealed from view from inside and outside the cabinet 10. Further, the top cover 16 for the cabinet 10 can be provided with an entry port whereby electrical/data conduit can be routed from a drop ceiling or an office furniture workspace dividing member so that electrical/data conduit can be seamlessly routed from a workspace dividing system without being open to view by users of the cabinet 10 as will be further described.

FIG. 2 shows the support frame 12 of the cabinet 10 comprising a top bracket 40, the vertical rails 14, the bottom bracket 18 and the feet 20. The top bracket 40 comprises four frame members 42 interconnected at upper surfaces of each of their respective ends by a corner bracket 44 so that the four frame members 42 form a rectangular frame with the corner brackets 44. A gap 46 is defined beneath each corner bracket 44 which is adapted to receive a portion of an upper end of a corresponding vertical rail 14. Fasteners 48 are provided for passing through aligned apertures in the corner bracket 44 and an upper end of the vertical rail 14.

Figure 9:
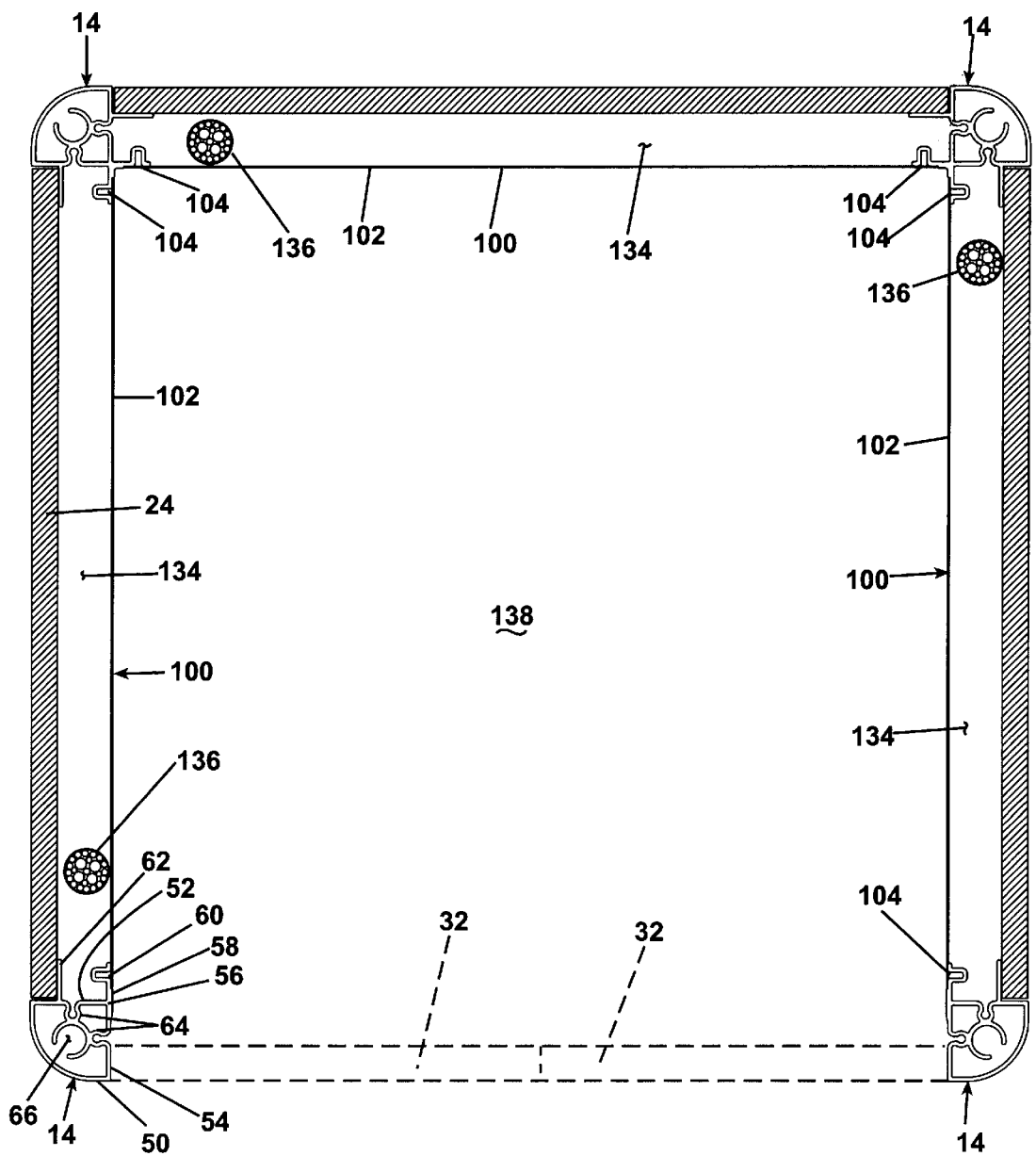
FIG. 9 is a generally horizontal cross-sectional view taken along lines 9—9 of FIG. 1 showing electrical/data conduit routed within a gap between the inner walls and outer panels of the cabinet according to the invention.

Each vertical rail 14 comprises an elongated member having a cross section shown in greater detail in FIG. 9. Each vertical rail comprises an aesthetically-pleasing smooth outer surface 50 and a pair of inner walls 52 and 54 which interconnect at a vertex 56. The vertical rails 14 adjacent to the font face of the cabinet 10 have an inner wall 54 provided with a planar extension 58 which has several spaced sockets 60 adapted to receive a conventional fastener therein. The vertical rails 14 adjacent to a rear face of the cabinet 10 have a pair of perpendicularly-disposed planar extensions 58 thereon. The different configurations of the vertical rails 14 can best be viewed in FIG. 9. The inner wall 52 is provided with a flange 62 located inwardly from an intersection with the outer surface 50 which is adapted to provide an abutting surface for an outer panel 24 so that an outer surface of the outer panel 24 can be mounted generally flush with the outer surface 50 of the vertical rail 14. A pair of flanges 64 extend inwardly from each of the inner walls 52 and 54 which terminate in a vertically opening socket 66 which is adapted to receive the fastener 48.

Turning back to FIG. 2, the bottom bracket 18 comprises four frame members 68 which are interconnected at lower surfaces of each of their respective ends by corner bracket 70 mounted to adjacent ends of a pair of frame members 68 so that the frame members 68 are supported at generally right angles with respect to one another and so that a gap 72 is formed above each corner bracket 70 adapted to receive a lower end of a corresponding vertical rail 14.

A pair of additional reinforcing frame member 68 can also be provided intermediate the ends of a pair of parallel frame member 68 to provide additional support to the bottom bracket 18 and prevent twisting or other deformation of the bottom bracket 18.

Each foot 20 comprises an upper portion 76 and a lower portion 78. The upper portion 76 comprises an aesthetically pleasing outer surface 80 having a lower edge 82 provided with a mounting flange 84 thereon. The lower portion 78 also comprises an aesthetically pleasing lower hemispherical surface 86 which is provided with an upwardly-extending shaft 88.

Figure 3:
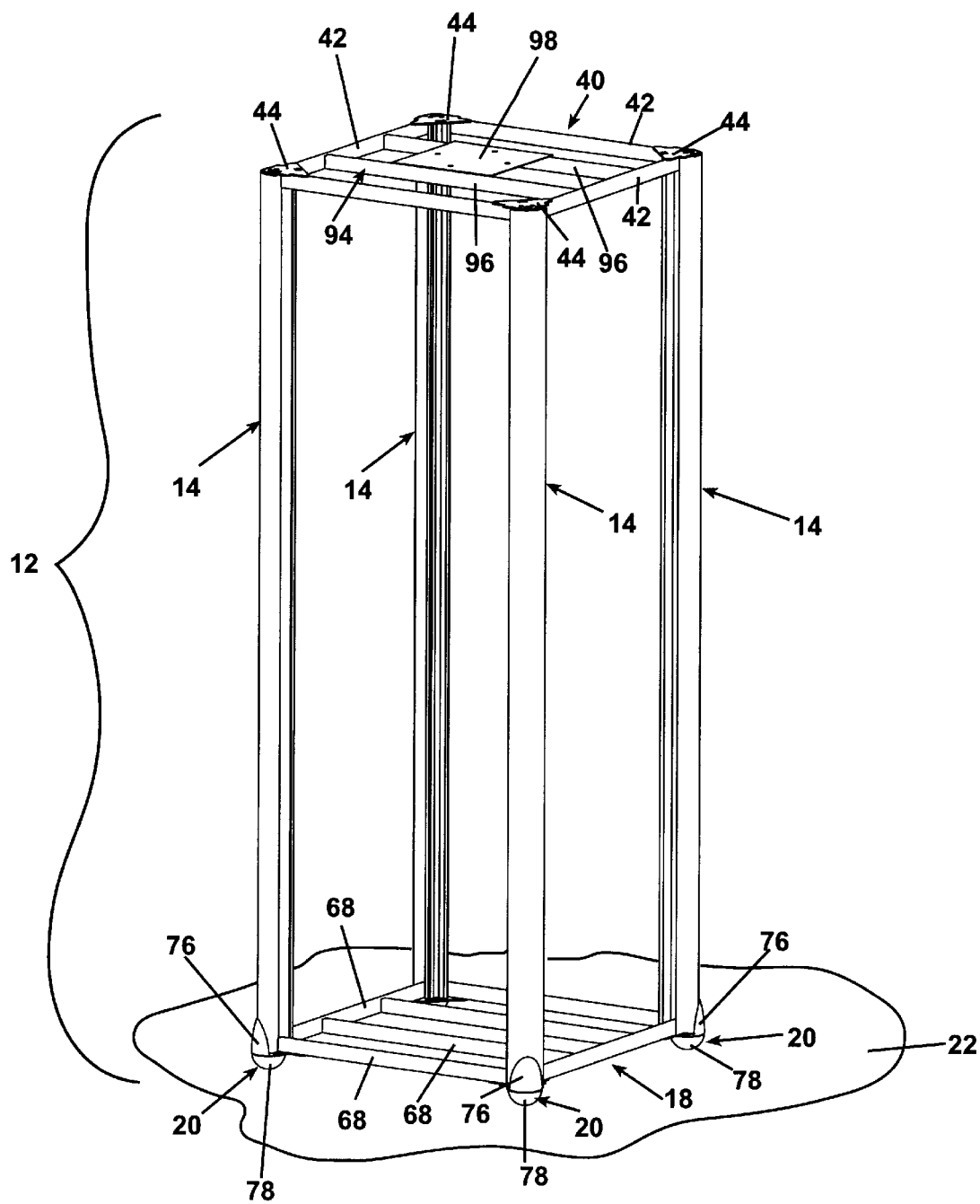
FIG. 3 is a perspective view of the components of the support frame of FIG. 2 or the cabinet of FIG. 1 after assembly.

The components shown in FIG. 2 are assembled to form the support frame 12 shown in its assembled state in FIG. 3. Along these lines, fasteners 48 are passed through each corner bracket 44 on the top bracket 40 into the socket 66 of a corresponding vertical rail 14. Additional structural support is provided by the inner and outer walls 52 and 54 of the vertical rail 14 positioned within the gap 46 beneath each corner bracket 44 which prevents twisting movement of the vertical rail 14 with respect to the top bracket 40. The bottom bracket 18 is assembled to each of the vertical rails 14 in the same manner. However, with respect to the bottom bracket 18, the feet 20 are also assembled to the corner brackets 70 of the bottom bracket 18 by passing the shaft 88 of a bottom portion 78 of each foot 20 within a boss 90 located on each corner bracket and mounting the upper portion 76 of each foot 20 to each corner bracket by passing fasteners 92 through the mounting bracket 84 on the lower edge 82 of each upper portion 76 of each foot 20.

It will be noted that the top bracket 40 can also preferably be provided with a column support bracket 94 which comprises a pair of frame members 96 extending laterally across the top bracket 40 between a pair of frame members 42 and which supports a plate 98 thereon. The column support bracket 94 is provided for interconnecting a column or post from an existing office furniture workspace dividing system discussed later with respect to FIG. 10.

The support frame 12 is shown in its assembled state in FIG. 3 whereby the top bracket 40 is supported above the bottom bracket 18 by the four vertical rails 14. The lower portions 78 of each foot 20 supports the support frame 12 on the ground surface 22.

Figure 4:
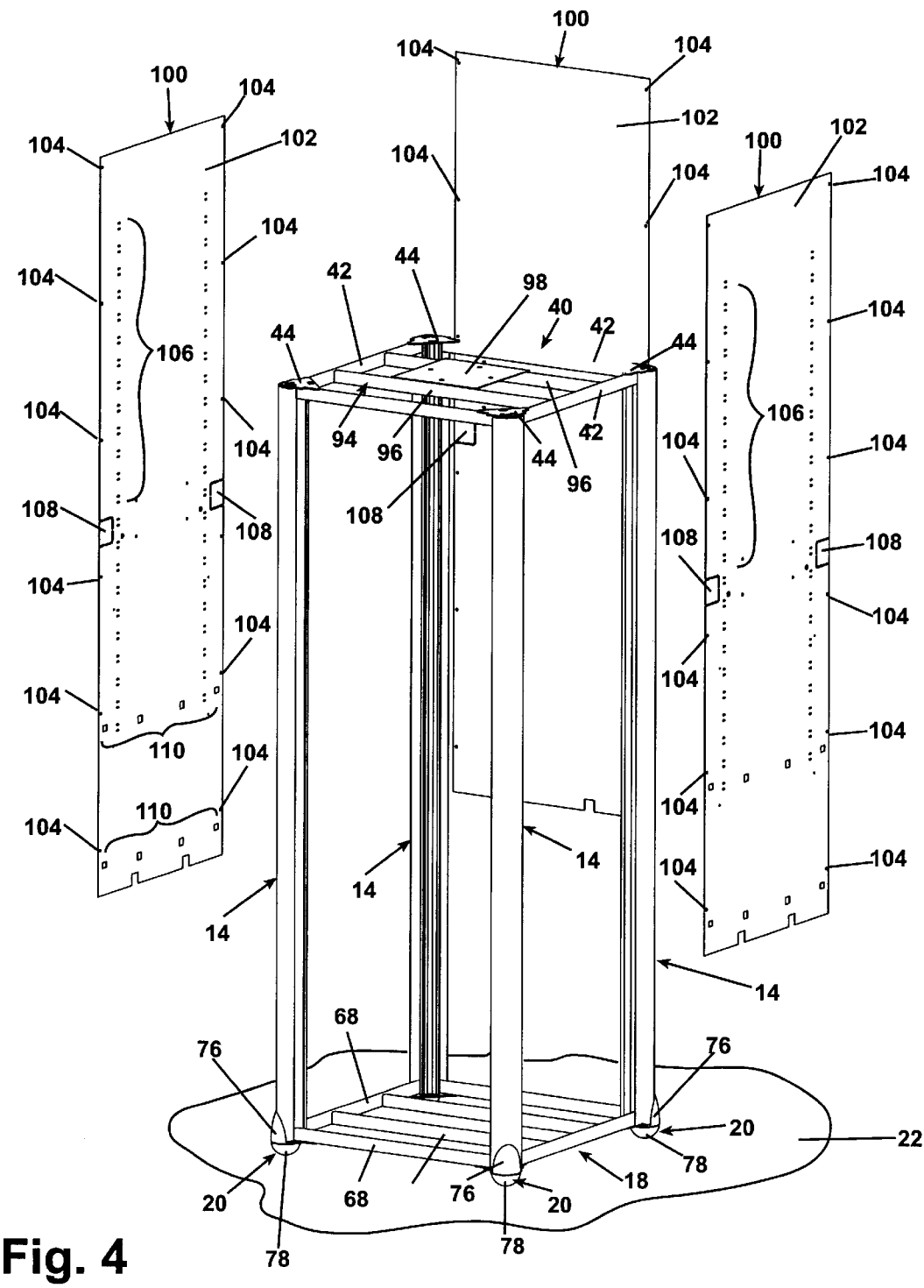
FIG. 4 is a fragmentary exploded perspective view of inner wall panels which are adapted to form three sides of the cabinet of FIG. 1 for mounting to the assembled support frame of FIG. 3.

FIG. 4 shows the assembled support frame 12 of FIG. 3 with several inner walls 100 located adjacent thereto. Each inner wall 100 comprises a panel 102 provided with several mounting apertures 104 located around the periphery thereof. The mounting apertures 104 are provided for the purpose of mounting each inner wall 100 to the support frame 12 to form interior walls for the cabinet 10. In addition to the mounting apertures 104, each of the inner walls 100 can also be provided with a wide variety of additional mounting apertures for mounting various components to the interior or exterior of the inner walls 100. For example, the inner wall 100 can be provided with a series of vertically-aligned apertures 106 which are provided for the purpose of hanging shelving brackets or other components on the interior of the cabinet 10. These types of vertically-aligned apertures 106 are often referred to as "vertical hanging intelligence." Each of the inner walls 100 can also be provided with cut-out portions 108 which are provided for the purpose of routing electrical/data conduit around the periphery of the interior of the cabinet 10. Further, several horizontally aligned apertures 110 can be provided in a spaced relationship for the purpose of mounting, drawer slide hardware for one or more of the drawers 34. It will further be understood that the pattern, configuration and alignment of the apertures 104, 106, 108, and 110 provided on the panels 102 of each inner wall 100 can be selected depending upon the configuration of the embodiments of the cabinet 10 shown in FIGS. 1, 1A, 1B, 1C, and other alternative embodiments thereof. Several conventional fasteners are passed through the mounting apertures 104 in each panel 102 of each inner wall 100 and into aligned apertures in the mounting rails 14 to mount the inner walls 100 to the vertical rails 14. The assembled state of the support frame 12 after the inner walls 100 are mounted to three sides thereof is shown in FIG. 5 and in greater detail in FIG. 9.

Figure 5:
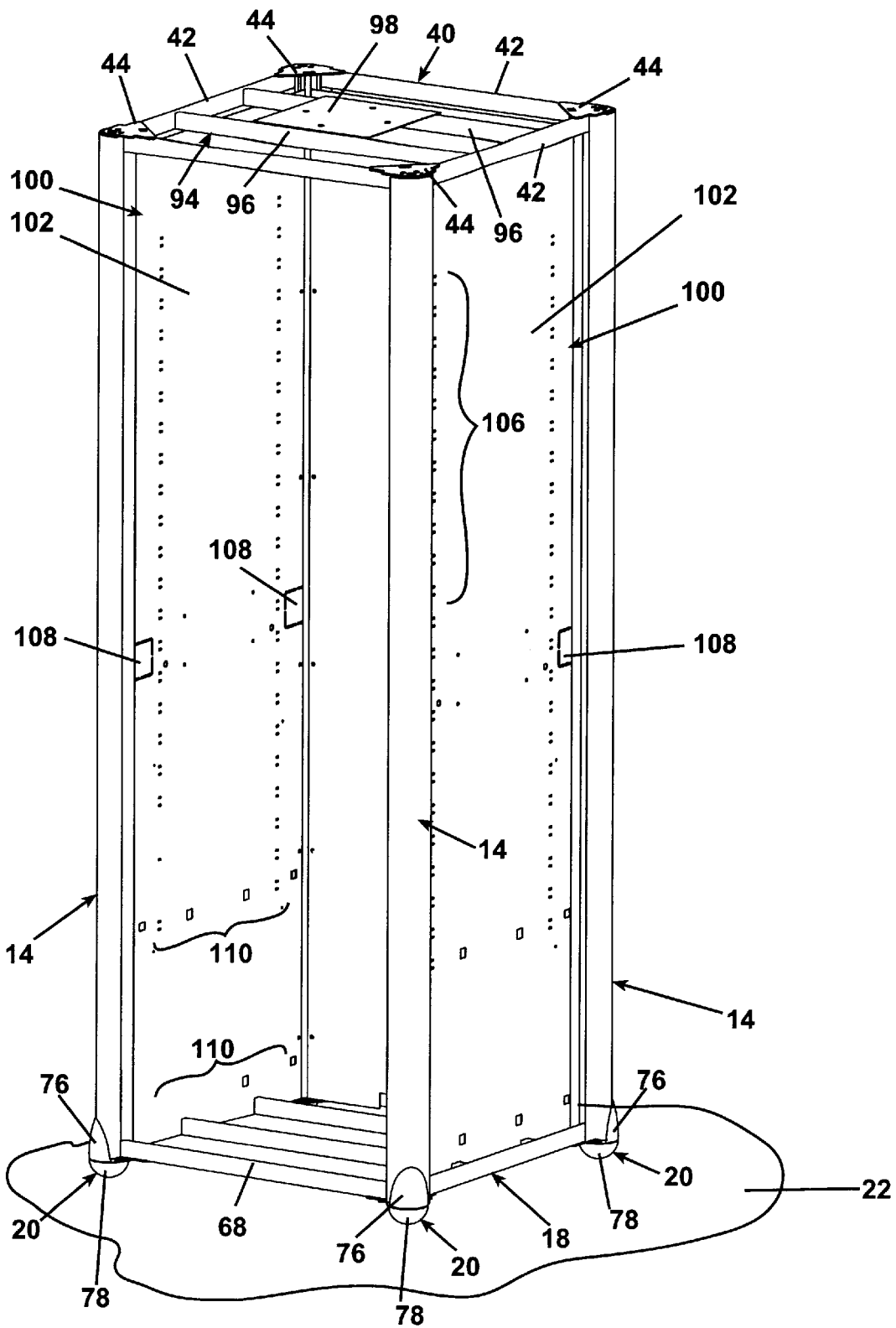
FIG. 5 is a perspective view of the inner wall panels of FIG. 4 mounted to the assembled support frame of FIG. 3.
Figure 6:
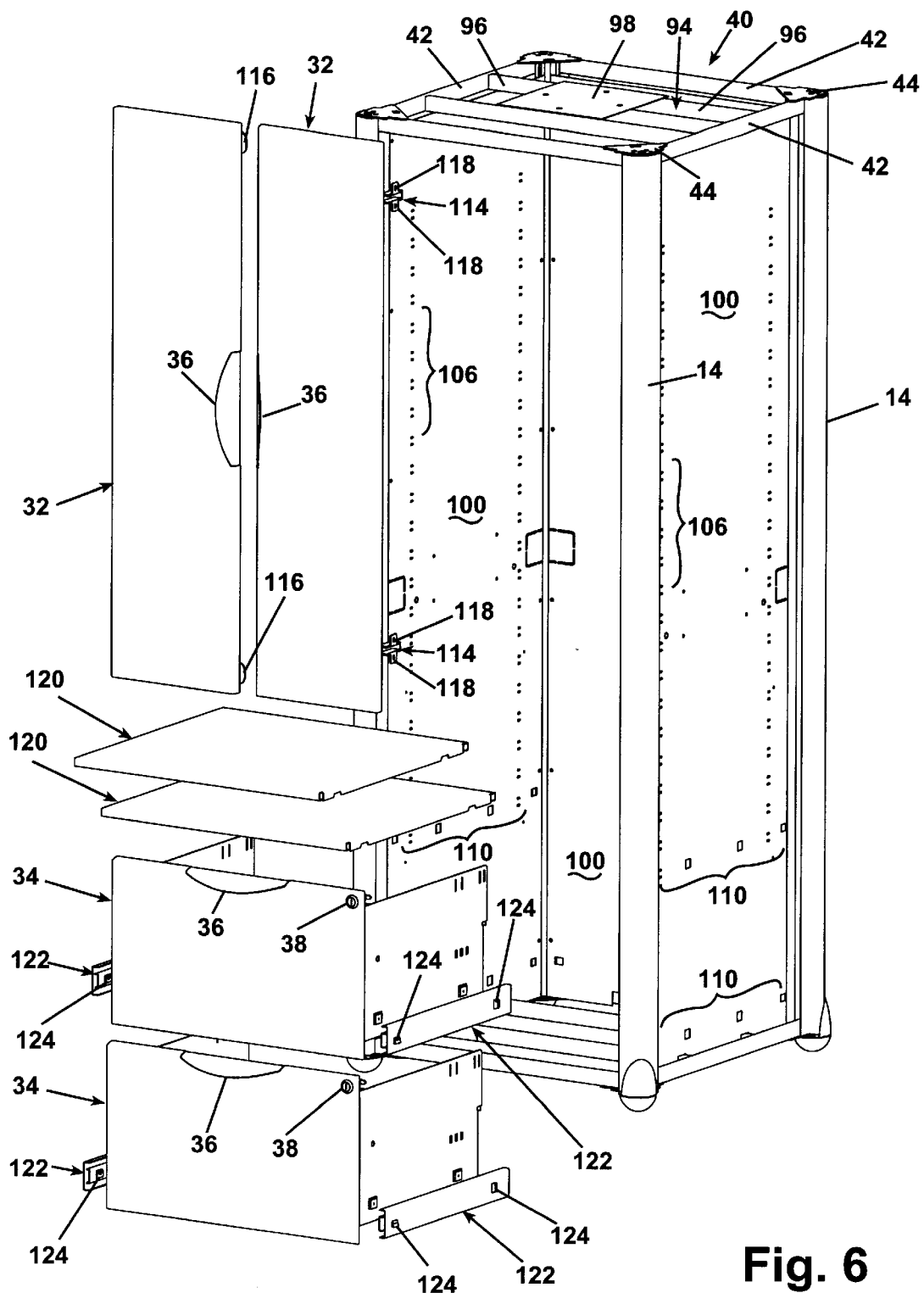
FIG. 6 is an exploded perspective view of hinged doors, cabinet dividers, and drawer assemblies positioned for mounting to the cabinet assembly of FIG. 5.

FIG. 6 shows various components such as doors 32 and drawers 34 positioned adjacent to the assembled support frame 12 of FIG. 5. The doors 32 are provided with conventional hinges 114 and stops 116 located adjacent upper and lower edges thereof. The hinges 114 preferably have mounting apertures 118 in a spaced alignment which corresponds to spacing of vertically-aligned apertures on the vertical rails 14. The hinges 114 on each door 32 can be mounted to the corresponding vertically-aligned apertures on selected side vertical rails 14 by conventional fasteners.

One or more divider shelves 120 can also be mounted to the inner walls 100 and specifically to the apertures 106 by conventional fasteners. Alternatively, brackets (not shown) can be provided for mounting, the divider shelves to the inner walls 100.

The drawers 34 are preferably provided with conventional drawer slides 122 which have hooked flanges 124 adapted for mounting between the drawer 34 and the horizontally-aligned apertures 110 on the inner walls 100. Preferably, the drawer slides 122 have a first portion mounted to the drawer 34 and a second portion slidably mounted to the first portion and fixedly mounted to a pair of side inner walls 100 of the support frame 12 so that he drawers can be open and closed in a conventional fashion. Further, it will be appreciated that the drawers 34 are designed to accommodate hanging file folders in either a side-to-side or front-to-back configuration.

Figure 7:
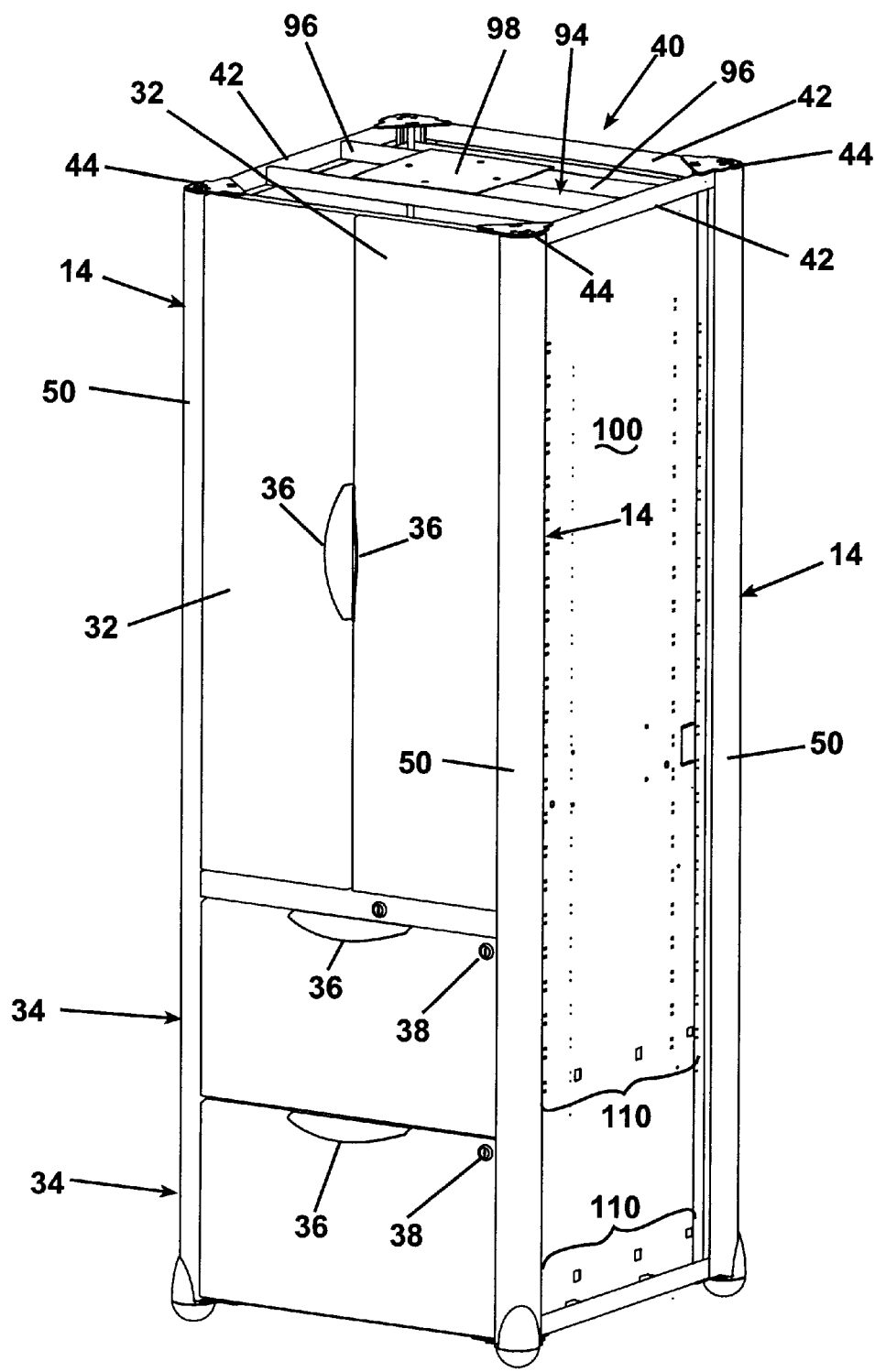
FIG. 7 is a perspective view of the cabinet assembly after the doors, dividers, and drawer components of FIG. 6 have been assembled thereto.

Once the doors 32 and drawers 34 are mounted to the support frame 12, the assembled support frame 12 has the appearance as shown in FIG. 7. It should be noted in FIG. 7 that the side inner walls 100 mounted to the support frame 12 are spaced inwardly from the outer surface 50 of the vertical rails 14.

Figure 8:
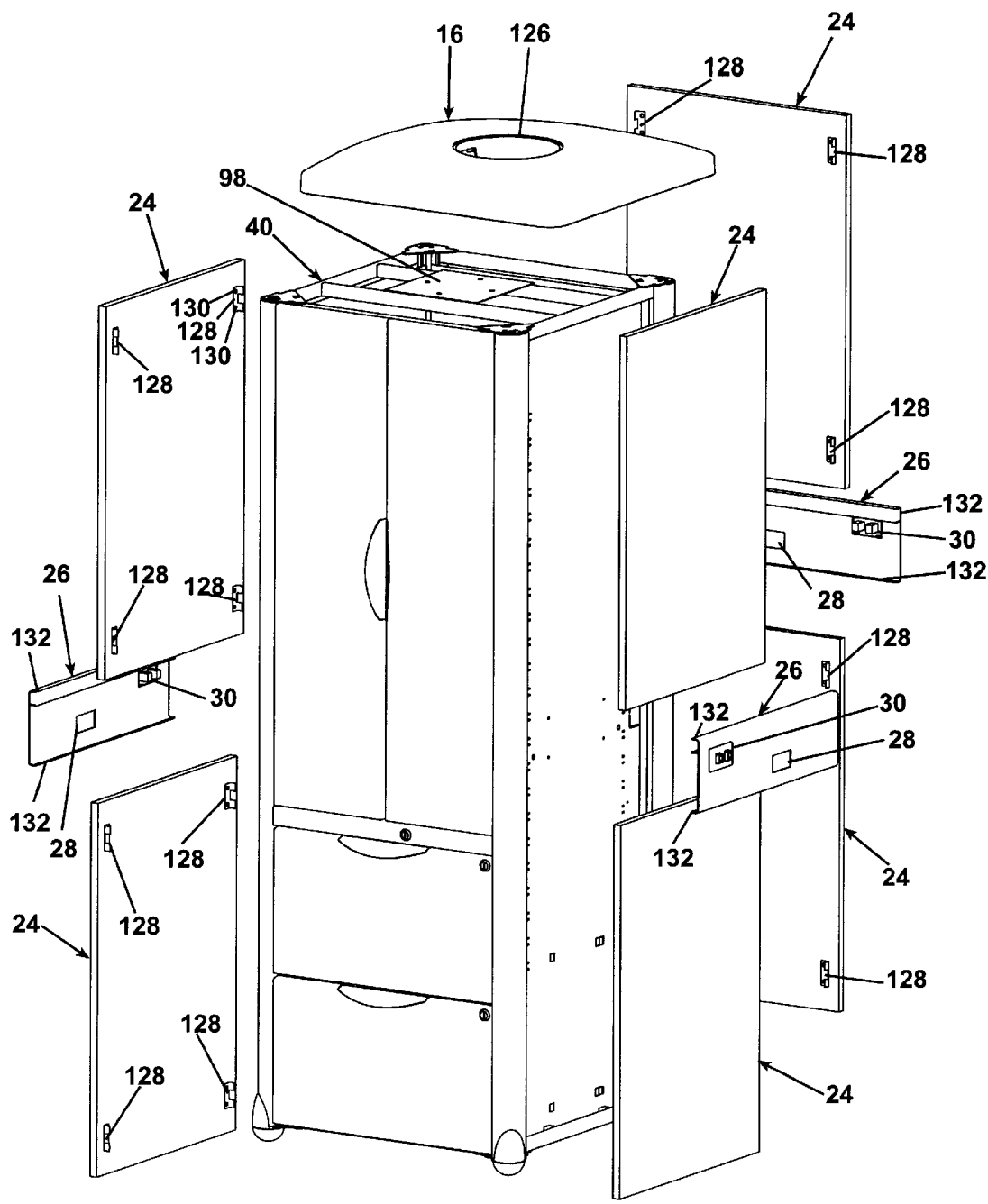
FIG. 8 is an exploded perspective view showing a top cover, outer wall panels and power panels positioned for mounting to the cabinet assembly of FIG. 7 whereby after the top cover, outer wall panels and power panels are assembled to the cabinet assembly of FIG. 7, the cabinet has the outer appearance of the cabinet of FIG. 1.

FIG. 8 shows the top cover 16, outer panels 24 and power panels 26 positioned adjacent the assembled support frame of FIG. 7. The top cover 16 preferably has a port 126 which is aligned with the plate 98 on the top bracket 40. The top cover 16 preferably has an interior profile which corresponds to a cross sectional shape of the top bracket 40 and is mounted in an snap-fit fashion thereto.

Each of the outer panels 24 preferably includes mounting clips 128 located adjacent each corner thereof and at other locations on the outer panel 24 as are structurally necessary. Each mounting clip 128 preferably comprises a pair of laterally-extending flanges 130 which are adapted to mount within corresponding apertures in the flange 62 located along the inner walls 52 of each vertical rail 14. The clips 128 thereby removably mount the outer panels 24 to the vertical rails 14. This is advantageous since the outer panels can be provided with a variety of differently colored or textured fabrics, erasable marker boards, paper management systems, glass, mirrors, and other surfaces so that the exterior aesthetic appearance of the cabinet 10 can be immediately changed merely by substituting differently-styled outer panels 24 onto the vertical rails 14 as previously described.

The power panels 26 are mounted to the vertical rails 14 by brackets so that a pair of rearwardly-extending edges 132 on the upper and lower edges of the power panel 26 are positioned between a pair of adjacent outer panels 24 so that the rearwardly-extending edges 132 appear generally flush with lower and upper edges of the adjacent outer panels 24.

The power panels 26 are easily removable from the cabinet 10 without additional hardware and/or fasteners. Thus, the electrical and data sockets 28 and 30, respectively, located on the power panel 26 can be easily interconnected to electrical/data conduit 136 routed throughout the cabinet 10 merely by removing the power panel 26 from its mounting to the cabinet 10, interconnecting the electrical/data conduit to the appropriate sockets 28 and 30, and remounting the power panel 26 to the cabinet 10.

Once the top cover 16, outer panels 24 and power panels 26 are mounted to the assembled support frame shown in FIG. 8, the assembled cabinet 10 has the appearance as shown in FIG. 1 (or perhaps as shown in FIGS. 1A–1C if an alternate embodiment for the cabinet 10 has been employed).

As shown in FIG. 9, once the inner walls 100 and outer panels 24, 26 are installed onto the support frame 12, a gap 134 is defined between the outer panels 24, 26 and inner walls 100 which is extremely conducive for the routing of electrical/data conduit (shown generally at 136 in FIG. 9). The electrical/data conduit 136 can be received through the port 126 in the top cover 16, routed along the plate 98 of the top bracket 40, and into the gap 134 located between a pair of corresponding outer panels 24, 26, and inner walls 100. The electrical/data conduit 136 can then be routed through the gap 134 to a corresponding power panel 26 and interconnected to an appropriate electrical and/or data socket 28 and 30, respectively. Alternatively, the electrical/data conduit 136 can be routed to the interior 138 of the cabinet 10 for interconnection to an electrical/data component (not shown) such as a laser printer or column computer or facsimile machine so that the component can be stored within the cabinet 10 and operably connected to a voice/data network without being seen from the exterior of the cabinet 10. Additionally, the electrical/data conduit 136 can be routed through the gap 134 to the floor surface 22 so that the electrical/data conduit 136 can merely be routed through the cabinet 10 and elsewhere as an office system requires.

Figure 10B:
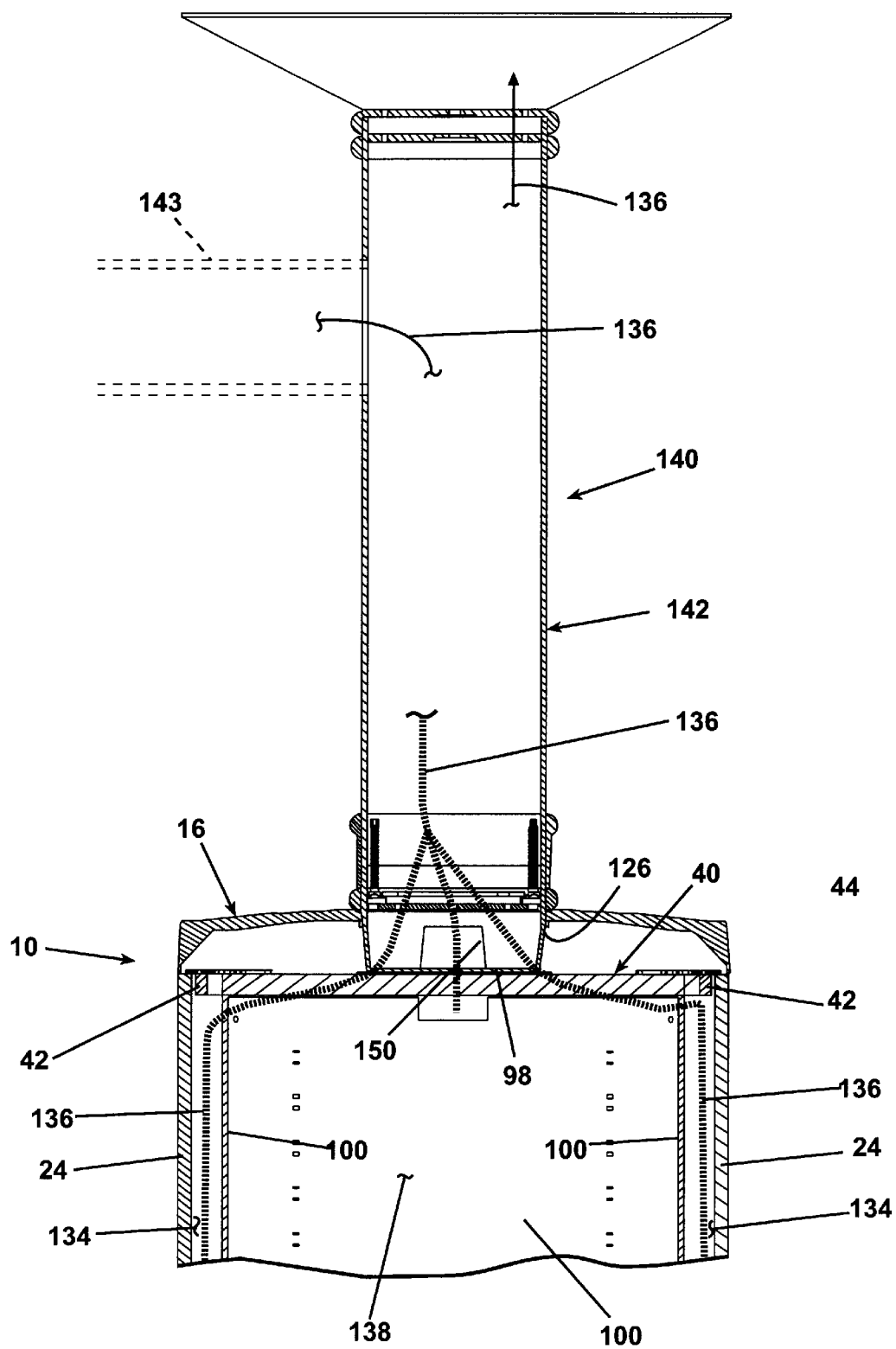
FIG. 10B is a cross-sectional view taken along lines 10B—10B of FIG. 10A.

Further, the cabinet 10 can be physically interconnected to an existing office furniture system 140 so that electrical/data conduit 136 routed through the existing system 140 including a column 142 in which the electrical/data conduit 136 is routed can be seamlessly interconnected to the port 126 on the top cover 16 of the cabinet 10 as shown in FIGS. 10A–10B. Further, the electrical/data conduit 136 can be routed through a gap 152 adjacent outer panels 24 from a generally horizontal member 154 of the existing office furniture system 140 as shown in FIG. 10C. An example of a workspace system 140 having columns 142 and horizontal beams 143 is shown in commonly-owned U.S. Provisional Patent Application Serial No. 60/088,070, titled "Column-based Workspace Definition System," filed Jun. 5, 1998, and is incorporated herein by reference.

The port 126 on the top cover 16 preferably corresponds in a diameter to the outer diameter of the column 142 of the existing system 140 whereby the column 142 rests either on the cover 16 or on the support plate 98 of the column support bracket 94 of the cabinet 10 so that the electrical/data conduit 136 present within the column 142 is seamlessly routed between the cabinet 10 and the existing system 140.

Figure 11:
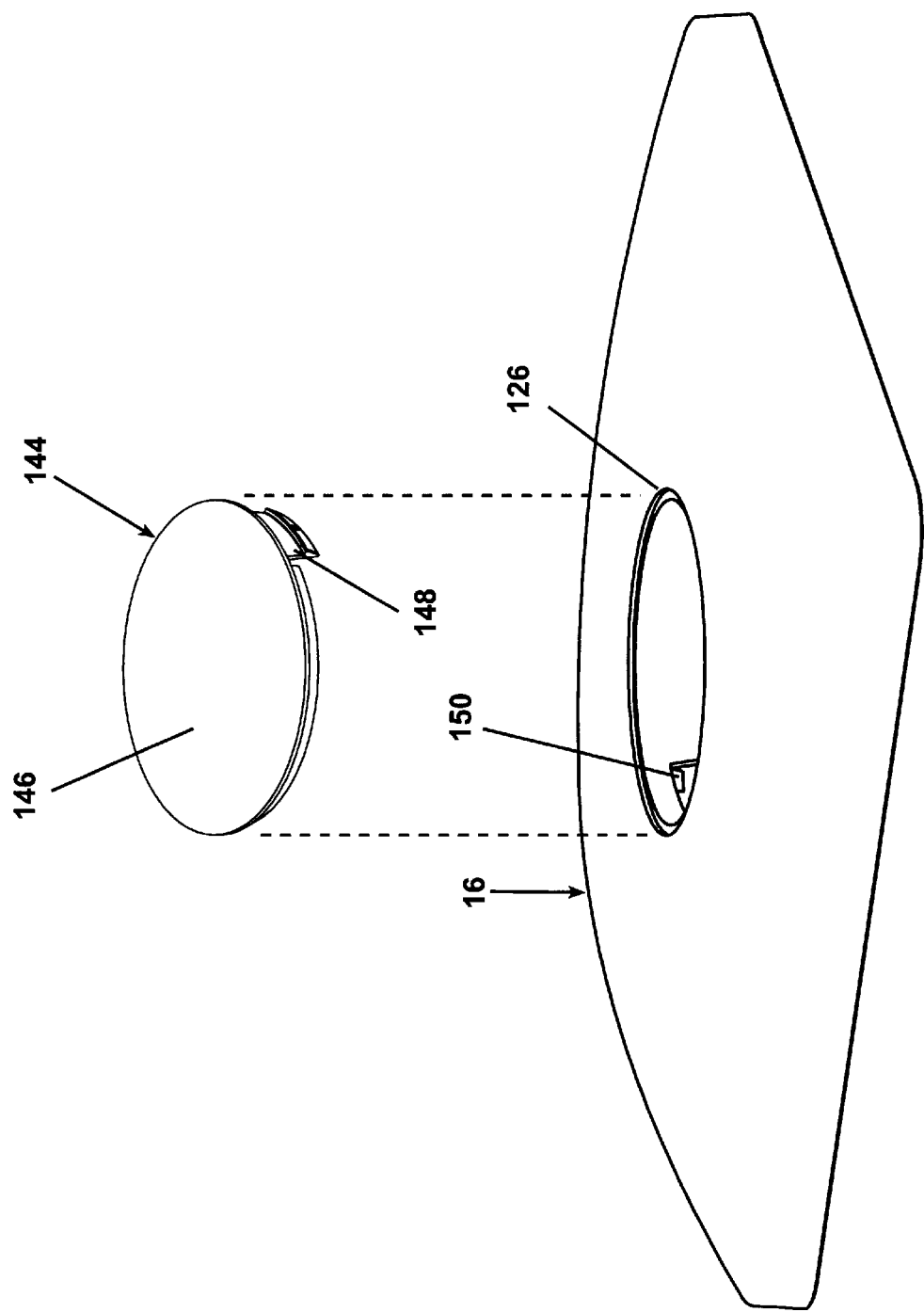
FIG. 11 shows a fragmentary perspective view of a plug for the port in the top cover shown in FIGS. 1, 1A, 1B, 1C and 10 for providing an aesthetically pleasing upper surface to the cabinet when the port is not used for routing electrical/data conduit between the cabinet and an existing office furniture system.

FIG. 11 shows a fragmentary perspective view of a plug 144 for the port 126 in the top cover 16 shown in FIGS. 1, 1A, 1B, 1C and 10A–10C for providing a flush upper surface to the cabinet 10 when the port 126 is not used for routing electrical/data conduit 136 between the cabinet 10 and an existing office furniture system 140. The plug 144 comprises a body 146 shaped to closely approximate the shape of the port 126 and having a pair of depending detent arms 148 adapted to snap-fit behind a shoulder 150 located in the periphery of the port 126. The plug 144 is thereby easily mounted and removed from engagement with the cover 16.

While the invention has been specifically described in connection with certain specific embodiments thereof, it is to be understood that this is by way of illustration and not of limitation, and the scope of the appended claims should be construed as broadly as the prior art will permit.

What is claimed is:

1. In a cabinet for a workspace definition system comprising a housing defined by a rear wall, a pair of side walls, a top wall and a bottom wall interconnected together to form an integral unit surrounding an interior chamber defining a storage area and having an open front accessible by a user, the improvement comprising:

at least one of the top wall and the rear wall as well as at least one of the side walls has inner and outer panels that define a gap therebetween, and further comprising an opening in the inner panel of the at least one of the top wall and the rear wall as well as at least one of the side walls, wherein each opening is aligned with an opening in an adjacent inner panel, wherein each inner panel separates the gap from the storage area in the interior chamber of the cabinet so that the gap can be used as an unimpeded raceway around the storage area and between gaps in adjacent walls via the openings, and further comprises an external port in at least one of the top wall, rear wall and the side walls in open communication with the gap; and a length of electrical/data conduit extends through the port into the gap;

whereby the electrical/data conduit is thereby passed into the raceway of the cabinet in a concealed manner to provide operability to components stored within the storage area or adjacent to the cabinet.

2. The cabinet of claim 1 wherein the port is provided in the top wall, further comprising a column with a hollow interior mounted to the top wall at the port, and the length of electrical/data conduit extends from the hollow interior of the column and into the port.

3. The cabinet of claim 1 wherein the port is provided in one of the rear wall and the side walls, further comprising a generally horizontal beam with a hollow interior mounted to the cabinet in overlying relationship to the port, and the length of electrical/data conduit extends from the hollow interior of the beam and into the port.

4. The cabinet of claim 1 wherein the rear wall and the side walls further comprise a rigid skeletal frame having inner panels mounted thereto that define the storage area and outer panels mounted thereto that define the outer surface of the rear wall and the side walls and which cooperate to define the gap therebetween for routing electrical/data conduit therethrough.

5. The cabinet of claim 4 wherein at least one of the outer panels is easily mounted and dismounted to the frame without the use of tools.

6. The cabinet of claim 5 wherein the at least one of the outer panels further comprises a plurality of clips, the frame comprises a plurality of openings in register with the plurality of clips, and the easy mounting and dismounting of the at least one of the outer panels to the frame is accomplished by inserting the clips within the openings.

7. The cabinet of claim 6 wherein at least one of the outer panels comprise at least one of an electrical receptacle and a data receptacle accessible from outside the cabinet, and operably interconnected to the length of electrical/data conduit routed within the cabinet.

8. The cabinet of claim 4 wherein at least one of the outer panels comprise at least one of an electrical receptacle and a data receptacle accessible from outside the cabinet, and operably interconnected to the length of electrical/data conduit routed within the cabinet.

9. The cabinet of claim 4 wherein the skeletal frame comprises a plurality of generally vertical rails rigidly interconnected at top ends thereof by a top bracket and at bottom ends thereof by a bottom bracket.

10. The cabinet of claim 9 wherein the vertical rails comprise a first flange and a second flange spaced inwardly from the first flange, wherein the outer panels are mounted to the first flange and the inner panels are mounted to the second flange.

11. The cabinet of claim 1 wherein at least one of the rear wall and the side walls includes at least one of an electrical receptacle and a data receptacle accessible from outside the cabinet, and operably interconnected to the length of electrical/data conduit routed within the cabinet.

12. The cabinet of claim 11 wherein the at least one of an electrical receptacle and a data receptacle comprises an electrical receptacle, and further comprising a power block mounted to one of the walls of the cabinet and operably interconnected to the electrical receptacle and to the length of electrical/data conduit.

13. The cabinet of claim 1 and further comprising a cap mountable within the port having an upper surface configured to wholly close the port when the length of electrical/data conduit is removed from the port.

14. The cabinet of claim 13 wherein the cap includes a plurality of detent arms adapted to snap-fit within the port.

15. The cabinet of claim 4 wherein at least one of the inner panels includes an opening adapted to receive a length of the electrical/data conduit therethrough.

16. The cabinet of claim 1 wherein the cabinet further comprises an open front, and further comprising at least one hinged door and at least one drawer mounted therein.

17. The cabinet of claim 1 and further comprising at least one door hinged to the housing in register with the open front and selectively concealing the storage area from view by occupants of the workspace definition system.

18. The cabinet of claim 17 and further comprising at least one drawer slidably mounted to the housing beneath the storage area of the interior chamber.

19. The cabinet of claim 6 wherein at least one of the outer panels comprise at least one of an electrical receptacle and a data receptacle accessible from outside the cabinet, and operably interconnected to the length of electrical/data conduit routed within the cabinet.

20. A cabinet for a workspace definition system comprising:
   a housing defined by a rear wall, a pair of side walls, a top wall and a bottom wall interconnected together to form an integral unit surrounding an interior chamber defining a storage area and having an open front accessible by a user;
   wherein one of the top wall, the rear wall and the side walls has an electrical/data receptacle mounted therein and accessible from the outside of the cabinet, and wherein the electrical/data receptacle is positioned at a height generally corresponding to the height of a typical worksurface in a workspace definition system.

21. The cabinet of claim 20 wherein the rear wall and the side walls further comprise a rigid skeletal frame having inner and outer panels mounted thereto and which define a gap therebetween for routing electrical/data conduit therethrough.

22. The cabinet of claim 20 wherein the rear wall and the side walls further comprise a rigid skeletal frame having inner and outer panels mounted thereto and which define a gap therebetween for routing electrical/data conduit therethrough.

23. The cabinet of claim 22 wherein at least one of the outer panels is easily mounted and dismounted to the frame without the use of tools.

24. The cabinet of claim 23 wherein the at least one of the outer panels further comprises a plurality of clips, the frame comprises a plurality of openings in register with the plurality of clips, and the easy mounting and dismounting of the at least one of the outer panels to the frame is accomplished by inserting the clips within the openings.

25. The cabinet of claim 22 wherein the skeletal frame comprises a plurality of generally vertical rails rigidly interconnected at top ends thereof by a top bracket and at bottom ends thereof by a bottom bracket.

26. The cabinet of claim 25 wherein the vertical rails comprise a first flange and a second flange spaced inwardly from the first flange, wherein the outer panels are mounted to the first flange and the inner panels are mounted to the second flange.

27. The cabinet of claim 22 and further comprising a length of electrical/data conduit routed within the gap having one end operably interconnected to the electrical/data receptacle.

28. The cabinet of claim 20 wherein the cabinet further comprises at least one of a hinged door mounted in the open front and at least one drawer mounted therein.

29. The cabinet of claim 20 and further comprising at least one door hinged to the housing in register with the open front and selectively concealing the storage area from view by occupants of the workspace definition system.

30. The cabinet of claim 29 and further comprising at least one drawer slidably mounted to the housing beneath the storage area of the interior chamber.

31. In a cabinet for a workspace definition system comprising a housing defined by a rear wall, a pair of side walls, a top wall and a bottom wall interconnected together to form an integral unit surrounding an interior chamber defining a storage area and having an open front accessible by a user, the improvement comprising:
   wherein at least one of the rear wall and the side walls has a port communicating with the interior chamber;
   further comprising a generally horizontal beam with a hollow interior mounted to the cabinet in overlying relationship to the port; and
   a length of electrical/data conduit extends between the hollow interior of the beam through the port and into the interior chamber;
   the electrical/data conduit passes into the interior chamber of the cabinet from the beam in a concealed manner to provide operability to components stored within or adjacent to the cabinet.

32. The cabinet of claim 31 and further comprising an electrical/data receptacle mounted to at least one of the rear wall and the side walls, wherein the at least one of the rear wall and side walls further comprises inner surface and outer panels with a gap therebetween, wherein the gap is contiguous with the hollow interior of the beam and the receptacle; whereby electrical/data conduit entering the cabinet through the port from the hollow interior of the beam can be routed to be interconnected with the receptacle through the gap between the inner and outer panels.

33. The cabinet of claim 32 wherein the receptacle is mounted to the outer panel and is accessible from the exterior of the cabinet.

34. The cabinet of claim 32 wherein the receptacle is mounted to the inner panel and is accessible from the interior chamber of the cabinet.

35. The cabinet of claim 31 and further comprising at least one door hinged to the housing in register with the open front and selectively concealing the storage area from view by occupants of the workspace definition system.

36. The cabinet of claim 35 and further comprising at least one drawer slidably mounted to the housing beneath the storage area of the interior chamber.

37. In a cabinet for a workspace definition system comprising a housing including a frame, a rear wall, a pair of side walls, a top wall and a bottom wall interconnected to the frame to form an integral unit surrounding an interior chamber defining a storage area and having an open front accessible by a user, the improvement comprising:

wherein the rear wall and the side walls comprise an inner panel and an outer panel mounted to the frame that define a gap therebetween, and further comprising an opening in the inner panel of the rear wall and the side walls, wherein each opening is aligned with an opening in an adjacent inner panel, wherein each inner panel separates the gap from the storage area in the interior chamber of the cabinet so that the gap can be used as an unimpeded raceway around the storage area and between gaps in adjacent walls via the openings;

wherein at least one of the top wall, the rear wall and the side walls further comprises a port communicating between the workspace definition system external to the cabinet and the gap; and a length of electrical/data conduit extends through the port into the gap;

the electrical/data conduit passes into the cabinet in a concealed manner to provide operability to components stored within or adjacent to the cabinet and can be routed throughout the cabinet via the raceway without affecting a user's accessibility to the storage area.

38. The cabinet of claim 37 and further comprising mounting components between the outer panel and the frame wherein the outer panel is easily mounted and dismounted to the frame without the use of tools.

39. The cabinet of claim 38 wherein the rear wall and the side walls further comprise a rigid skeletal frame which mount the inner and outer panels thereto.

40. The cabinet of claim 37 wherein the port is provided in the top wall, further comprising a column with a hollow interior mounted to the top wall at the port, and the length of electrical/data conduit extends from the hollow interior of the column and into the port.

41. The cabinet of claim 37 wherein the port is provided in one of the rear wall and the side walls, further comprising a generally horizontal beam with a hollow interior mounted to the cabinet in overlying relationship to the port, and the length of electrical/data conduit extends from the hollow interior of the beam and into the port.

42. The cabinet of claim 37 and further comprising at least one door hinged to the housing in register with the open front and selectively concealing the storage area from view by occupants of the workspace definition system.

43. The cabinet of claim 42 and further comprising at least one drawer slidably mounted to the housing beneath the storage area of the interior chamber.

44. In a cabinet for a workspace definition system comprising a housing defined by a rear wall, a pair of side walls, a top wall and a bottom wall interconnected together to form an integral unit surrounding an interior chamber, the improvement comprising:

wherein one of the top wall, the rear wall and the side walls further comprises a port;

a rigid skeletal frame having inner and outer panels mounted thereto and which define a gap therebetween for routing electrical/data conduit therethrough, the skeletal frame comprises a plurality of generally vertical rails rigidly interconnected at top ends thereof by a top bracket and at bottom ends thereof by a bottom bracket, the vertical rails comprise a first flange and a second flange spaced inwardly from the first flange, wherein the outer panels are mounted to the first flange and the inner panels are mounted to the second flange; and a length of electrical/data conduit extends through the port between the inner and outer panels into at least one of the rear wall, the side walls, and the interior chamber of the cabinet;

whereby the electrical/data conduit is thereby passed into the walls and the interior chamber of the cabinet in a concealed manner to provide operability to components stored within or adjacent to the cabinet.

45. The cabinet of claim 44 wherein at least one of the outer panels is easily mounted and dismounted to the frame without the use of tools.

46. The cabinet of claim 45 wherein the at least one of the outer panels further comprises a plurality of clips, the frame comprises a plurality of openings in register with the plurality of clips, and the easy mounting and dismounting of the at least one of the outer panels to the frame is accomplished by inserting the clips within the openings.

47. The cabinet of claim 44 wherein at least one of the outer panels comprise at least one of an electrical receptacle and a data receptacle accessible from outside the cabinet, and operably interconnected to the length of electrical/data conduit routed within the cabinet.

48. A cabinet for a workspace definition system comprising:

a housing defined by a rear wall, a pair of side walls, a top wall and a bottom wall interconnected together to form an integral unit surrounding an interior chamber defining a storage area and having an open front accessible by a user, the housing further comprises a rigid skeletal frame having inner and outer panels mounted thereto and which define a gap therebetween for routing electrical/data conduit therethrough, the skeletal frame comprises a plurality of generally vertical rails rigidly interconnected at top ends thereof by a top bracket and at bottom ends thereof by a bottom bracket, the vertical rails comprise a first flange and a second flange spaced inwardly from the first flange, wherein the outer panels are mounted to the first flange and the inner panels are mounted to the second flange;

at least one of the top wall, the rear wall and the side walls has an electrical/data receptacle mounted therein and accessible from the outside of the cabinet.

49. The cabinet of claim 48 wherein the electrical/data receptacle is positioned at a height generally corresponding to the height of a typical worksurface in a workspace definition system.

50. The cabinet of claim 49 wherein at least one of the outer panels is easily mounted and dismounted to the frame without the use of tools.

51. The cabinet of claim 50 wherein the at least one of the outer panels further comprises a plurality of clips, the frame comprises a plurality of openings in register with the plurality of clips, and the easy mounting and dismounting of the at least one of the outer panels to the frame is accomplished by inserting the clips within the openings.

52. The cabinet of claim 49 and further comprising a length of electrical/data conduit routed within the gap having one end operably interconnected to the electrical/data receptacle.

53. In a cabinet for a workspace definition system comprising a housing defined by a rear wall, a pair of side walls, a top wall and a bottom wall interconnected together to form an integral unit surrounding an interior chamber defining a storage area and having an open front accessible by a user, the improvement comprising:

wherein the top wall has a port communicating with the interior chamber;

a column with a hollow interior mounted to the top wall overlying the port; and a length of electrical/data conduit extends between the hollow interior of the column through the port and into the interior chamber;

an electrical/data receptacle mounted to one of the rear wall and the side walls, wherein the one of the rear wall and side walls further comprises inner and outer panels with a gap therebetween, wherein the gap is contiguous with the hollow interior of the column and the receptacle; whereby electrical/data conduit entering the cabinet through the port from the hollow interior of the column can be routed to be interconnected with the receptacle through the gap between the inner and outer panels, wherein the receptacle is mounted to the inner panel and is accessible from the interior chamber of the cabinet;

whereby the electrical/data conduit passes into the interior chamber of the cabinet from the column in a concealed manner to provide operability to components stored within or adjacent to the cabinet.

* * * * *